(12) United States Patent
Kim et al.

(10) Patent No.: US 6,856,160 B1
(45) Date of Patent: Feb. 15, 2005

(54) MAXIMUM VCC CALCULATION METHOD FOR HOT CARRIER QUALIFICATION

(75) Inventors: Hyeon-Seag Kim, San Jose, CA (US); Amit P. Marathe, Milpitas, CA (US); Nian Yang, San Jose, CA (US); Tien-Chun Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/166,105

(22) Filed: Jun. 10, 2002

(51) Int. Cl.$^7$ .................. G01R 31/26; G01R 31/28
(52) U.S. Cl. .................. 324/766; 324/765; 324/769
(58) Field of Search ........................... 324/765, 766, 324/769; 438/17; 702/182; 714/1, 47

(56) References Cited

U.S. PATENT DOCUMENTS

| | | | |
|---|---|---|---|
| 5,594,349 A | * | 1/1997 | Kimura ............... 324/551 |
| 5,598,009 A | | 1/1997 | Bui |
| 5,600,578 A | | 2/1997 | Fang et al. |
| 5,606,518 A | * | 2/1997 | Fang et al. ............ 703/13 |
| 5,726,458 A | | 3/1998 | Bui |
| 5,750,435 A | | 5/1998 | Pan |
| 5,999,011 A | * | 12/1999 | Chu et al. ............ 324/769 |
| 6,022,799 A | | 2/2000 | Foote et al. |
| 6,047,247 A | | 4/2000 | Iwanishi et al. |
| 6,051,984 A | | 4/2000 | Huang et al. |
| 6,057,582 A | | 5/2000 | Choi |
| 6,114,210 A | | 9/2000 | Wu et al. |
| 6,198,301 B1 | | 3/2001 | Chetlur et al. |
| 6,214,670 B1 | | 4/2001 | Shih et al. |
| 6,242,937 B1 | | 6/2001 | Lee et al. |
| 6,278,964 B1 | | 8/2001 | Fang et al. |
| 6,288,433 B1 | | 9/2001 | Akram et al. |
| 6,297,535 B1 | | 10/2001 | Gardner et al. |
| 6,326,313 B1 | | 12/2001 | Couteau et al. |
| 6,335,549 B1 | | 1/2002 | Kusunoki et al. |
| 6,352,891 B1 | | 3/2002 | Kasai |
| 6,424,930 B1 | * | 7/2002 | Wood ............... 702/184 |
| 6,633,177 B1 | * | 10/2003 | Okada ............... 324/765 |

OTHER PUBLICATIONS

*The Complete Solution for Automated Hot–Carrier Stress and Lifetime Extraction*, © BTA Technology, printed in U.S.A. May 1997, 8 pp.
*Evaluation of Hot Carrier Induced Degradation of MOS-FET Devices (Application Note 4156–3)*, © 1998, 2000 Agilent Technologies, printed in U.S.A. Nov. 2000, 4 pp.
*Hot Carrier Stress Testing and Analysis Package (Version 5.0)*, Keithley Instruments, Inc., (month unavailable) 1998, 2 pp.

* cited by examiner

Primary Examiner—Ernest Karlsen
(74) Attorney, Agent, or Firm—Foley & Lardner LLP

(57) ABSTRACT

A method of generating an operating condition projection corresponding to a predetermined lifetime for semiconductor devices is disclosed. The disclosed method includes collecting lifetime information from a plurality of semiconductor devices at more than one stress condition by inducing a predetermined drain-source voltage for each stress condition. The method also includes determining the median lifetime for semiconductor devices at each of the stress conditions. Further, the method includes calculating a lifetime at each stress condition at which a predetermined percentage of the devices will exceed and extrapolating the lifetime for devices used at operating conditions.

9 Claims, 7 Drawing Sheets

MAXIMUM VCC CALCULATION METHOD FOR HOT CARRIER QUALIFICATION

REFERENCE TO RELATED PATENT APPLICATIONS

This application is related to U.S. patent application Ser. No. 10/165,879, entitled "Hot Carrier Oxide Qualification Method", and filed on the same day herewith.

BACKGROUND

As devices achieve smaller and smaller geometries, electric fields across the oxide layer and between drain and source can become larger. As these electric fields are increased there is correspondingly an increased probability that several harmful effects are induced. These harmful effects include impact ionization, hot carrier interface damage, and hot carrier injection (HCI) into the oxide. As interface damage and/or charge trapping occurs in the oxide, performance of the semi-conductor device may be degraded to the point of failure or to the point at which the risk of failure is large.

Conventionally, characterizing the impact of hot carrier injection requires measuring a set of baseline parameters, such as, but not limited to, drain-source voltage (Vds), substrate current (Isub), etc. A series of stress cycles at different stress levels (i.e., elevated Vds or Isub states) are used to accentuate the hot carrier injection problem. The device parameters are tracked and measured after each stress cycle, thereby providing some indication of the cumulative degradation resulting from the stress test. Prediction of real device performance under normal operating or use conditions can be extrapolated from the results of the stress test.

The phenomenon of punchthrough voltage reduction due to hot-carrier injection of charged particles into the gate oxide of IGFETs is known in the art (see, e.g., U.S. Pat. No. 5,606,518). The phenomenon occurs during post-manufacture use. When a field effect transistor (FET) is held in a turned-on state (conductive state), charge carriers move through a channel region of the transistor from the source region to the drain region. The moving charge carriers gain energy as they come closer to the drain region. Some of the highly-energized charge carriers that are approaching the drain region collide with nuclei of the channel region and generate electron-hole pairs or other ionized anomalies. Due to the distribution of electric fields near the drain, the electron and hole of each collision-induced electron-hole pair tend to separate from one another and preferentially migrate towards or away from the gate of the device. Some of the migrating charge-particles become trapped in the gate insulating layer that separates the gate from, the channel or at the interface of the gate insulating layer and the channel.

When a turn-off voltage is later applied to the gate of the same transistor for the purpose of switching the transistor into an off state, it is expected that no current will flow through the device. However, the charged particles which have collected over time and become trapped at the channel/gate-insulator interface, or within the gate insulating layer, reduce the effective channel length. This in turn reduces the punchthrough voltage ($V_{pt}$) of the device. Operation at or above the punchthrough level induces an undesirable flow of leakage current between the source and drain. Such leakage current, when it occurs due to operation at or slightly above $V_{pt}$, is typically on the order of one or less microampere ($\leq 1$ $\mu A$) per transistor and is rarely thought to be of consequence when one considers a circuit having only a few transistors.

However, modern integrated circuit designs usually call for the inclusion of millions of transistors on a single monolithic substrate. A leakage current of just one nanoampere (nA) per transistor translates into a larger scale leakage current of one or more milliamperes (mA) per integrated circuit (IC) chip in high-density designs that include millions of transistors per IC chip. This magnitude of leakage is generally unacceptable in low-power environments. It is particularly unacceptable when the IC chip is one of many similarly leaking devices, all residing in a system that is supposed to have very low power consumption.

An example of such a power-frugal system is a portable "notebook" or "handheld" computer that is to be powered by a battery of limited amp/hours. It is common to require such a computer to have one or more power-conserving standby modes in which the power consumption of inactive computing resources is minimized by putting them to "sleep". This helps to extend the operating time of the computer after each battery charge.

System lifetimes (that is, time prior to a predetermined amount of device degradation has occurred) are typically specified as being at least 1 year to 3 years in order to satisfy consumer warranty requirements, and more often as being at least 5 to 10 years, to satisfy market requirements. The required lifetime of a given system can, of course, be much longer. It is often required, or at least desirable, to keep the power consumption of circuits that are in low-power standby mode below a specified maximum during the specified lifetime of the system.

Conventional maximum Vcc calculations are based only on an Isub/W versus lifetime relationship. However, to get the Vcc condition (which is usually much lower than a test stress condition), it is needed to extrapolate Isub/W from the relationship, i.e., Isub/W versus $1/V_{ds}$. However, this relationship is not always linear, and it is often difficult to find the co-relationship trend from Ig/W versus $1/V_{ds}$ for thick oxide (>50 Å) p-channel devices due to the small gate leakage current. Accordingly, it is much better to generate a simple relationship $1/V_{ds}$ versus lifetime. However, conventionally this method (i.e., typical commercial method) only collects median ($\tau 50$) case for hot carrier reliability.

Thus, there is a need for a method in which the nominal HCI lifetime may be obtained without counting any critical dimension variation or mechanical stress induced channel stress variation. There is also a need for a method that may be expected to give higher lifetime than conventional methods. Because each technology shows some sort of corner-to-corner variation in terms of Isub as well as Idsat, there is a need for a method to choose the $\tau 0.1$ for a safer lifetime projection rather than a simple median ($\tau 50$) case. The current simple median ($\tau 50$) case cannot count any Isub/Idsat variation by extrinsic factors.

It would be desirable to provide a system and/or method that provides one or more of these or other advantageous features. Other features and advantages will be made apparent from the present specification. The teachings disclosed extend to those embodiments which fall within the scope of the appended claims, regardless of whether they accomplish one or more of the above-mentioned needs.

SUMMARY

An exemplary embodiment relates to a method of generating a lifetime projection for semiconductor devices. The method includes collecting device lifetime information for a plurality of semiconductor devices at more than one stress condition. The stress condition is based on an induced drain-source voltage stress condition. The method also includes calculating, for each stress condition, a lifetime level at which a predetermined percentage of devices will exceed. Each lifetime level is a data point on the stress condition versus lifetime graph. Further, the method of generating a lifetime projection for semiconductor devices includes calculating the slope of an interpolated line through the data point for each stress condition versus lifetime graph. Further still, the method includes determining a line corresponding to a ratio of substrate current to gate current versus drain voltage relationship that satisfies the lifetime level, based on the interpolated line information.

Another exemplary embodiment relates to a method of generating a lifetime projection for semiconductor devices. The method includes collecting lifetime information from a plurality of semiconductor devices at more than one stress condition by inducing a predetermined drain-source voltage for each stress condition. The method also includes determining the median lifetime for semiconductor devices at each of the stress conditions. Further, the method includes determining information for semiconductor devices in a first mode. Further still, the method includes calculating a lifetime at each stress condition at which a predetermined percentage of the devices will exceed. Further still, the method includes extrapolating the lifetime for devices used at operating conditions.

Yet another exemplary embodiment relates to a method of determining operating conditions for semiconductor devices based on projected lifetime. The method includes establishing a maximum relationship between a ratio of substrate current to gate current and drain voltage by testing the semiconductor devices at stress conditions, each stress condition corresponding to an induced drain-source voltage. The method also includes subjecting a semiconductor device to an operating condition. Further, the method includes determining the ratio for the semiconductor device and comparing the ratio to the maximum relationship.

Yet still another exemplary embodiment relates to a method of generating a lifetime projection for semiconductor devices. The method includes collecting lifetime information from a plurality of semiconductor devices at more than one stress condition each stress condition corresponding to a predetermined drain-source voltage. The method also includes determining that the lifetime information at a stress condition approximates a bimodal distribution, having a first and a second mode. Further, the method includes determining information for semiconductor devices in the first mode. Further still, the method includes calculating a lifetime at each stress condition based on information related to the first mode. Further still, the method includes extrapolating the lifetime for devices used at operating conditions.

Alternative exemplary embodiments relate to other features and combination of features as may be generally recited in the claims.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION OF EXEMPLARY EMBODIMENTS

Figure 1:
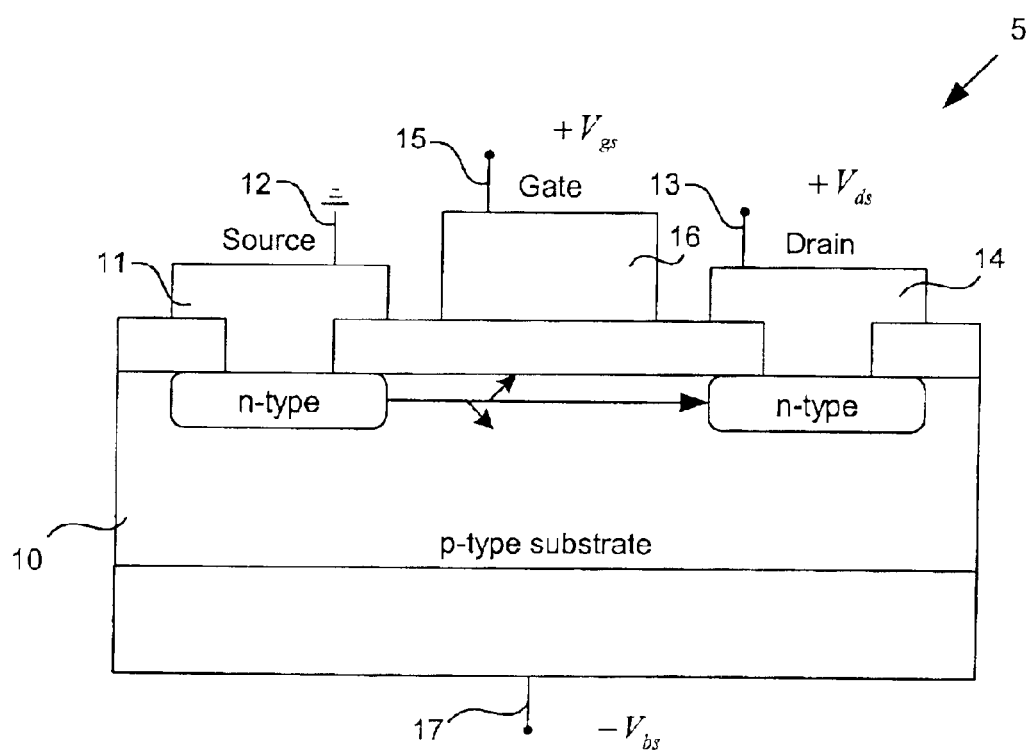
FIG. 1 is an exemplary cross section of a semiconductor device with which the invention may be associated.

Referring to FIG. 1, an exemplary cross-sectional view of an n-channel transistor 5 (such as, but not limited to an n-type metal oxide semiconductor (MOS) device) on a p-substrate 10 is depicted with voltages connected for testing of and/or qualification of devices due to hot carrier injection (HCI) degradation problems. Transistor 5 is representative of the type of semiconductor device to which the processes described may be applied. Source 11 may be coupled to a ground 12. Positive voltage Vds 13 is connected to drain 14. Positive voltage Vgs 15 is connected to gate 16. In an exemplary embodiment, gate voltage Vgs 15 is of a lower magnitude than drain voltage Vds 13. A substrate back bias, −Vbs 17 is connected to substrate 10.

Figure 2:
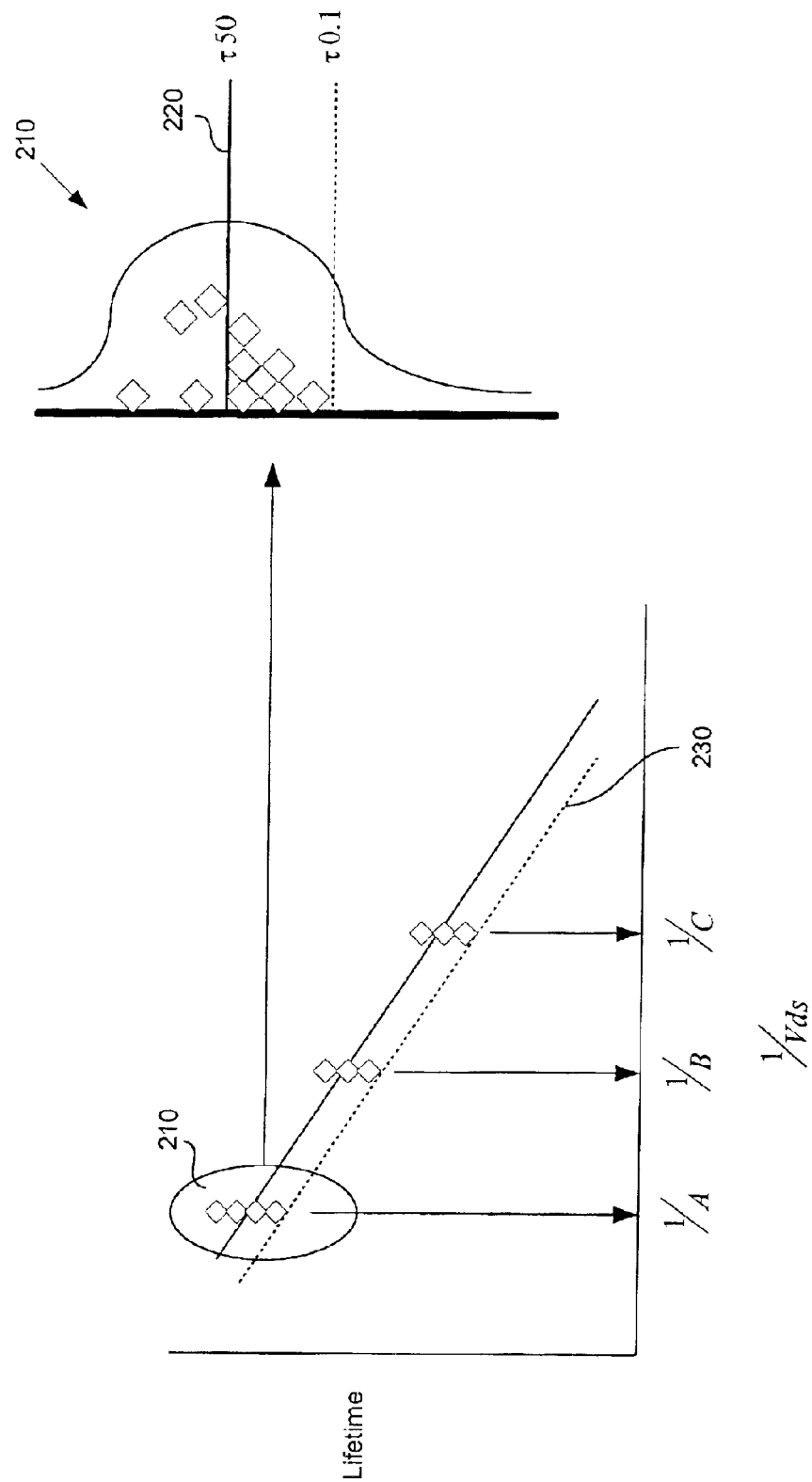
FIG. 2 is an exemplary graphical representation of the device lifetime versus Isub/W and an associated sample distribution.

A number of devices (two or more) such as n-channel transistor 5 may be coupled to an electronic test monitor which induces stress environments in the devices and collects data therefrom. Referring now to FIG. 2, a collection of data representing the inverse of drain-source voltage (1/Vds) versus lifetime is depicted. Groups of semiconductor devices such as but not limited to transistor 5 are stressed at three different conditions, condition 1/A, 1/B, and 1/C relating to different values of 1/Vds. For each group, for example group 1/A 210, a sample distribution of the collected information is gathered and statistically organized and analyzed to provide a mean lifetime 220 (τ50) for the stress condition as well as a standard deviation (σ). From that information a lifetime level τ0.1 (i.e., a lifetime at which 99.9 percent of the devices at the stress condition will exceed) may be determined by the following equation $$\tau 0.1 = \tau 50 \times \exp(-cdf^{-1}(0.1\%) \times \sigma), \quad (1)$$

where cdf is the cumulative distribution function, which represents the probability that the lifetime is less than or equal to τ0.1 and σ is the standard deviation of the distribution.

Similar distributions and calculations of τ0.1 are carried out for stress conditions 1/B and 1/C. After calculations of τ0.1 have been made, a line representing τ0.1 may be fit utilizing any of a variety of regression techniques including linear interpolation which is representative of τ0.1 lifetime versus the current to width ratio.

From the approximated relationship 230, the slope and intercept may be generated (either calculated or graphically). Accordingly, Vds (Vcc) which corresponds to the maximum value at which a desired lifetime is achieved, may be calculated.

Approximate lifetime may also be calculated by using the following equation for n-type and p-type transistors $$\tau = \sigma \exp(n/Vds), \quad (2)$$

where n is the slope and σ is the intercept of the plot of log (τ) versus 1/Vds.

In an exemplary embodiment, HCI lifetime may be evaluated at room temperature under optimum DC aging conditions. Gate voltage may be chosen for drain voltage producing worse-case HCI conditions. HCI lifetime may be evaluated under room temperature under aging conditions of Vds and Vgs at maximum substrate current for high voltage n-type MOS, low voltage n-type MOS having less than 0.32 micron channeling and p-channel devices with Vgs at maximum gate current for high voltage p-type MOS devices having channel length larger than 0.32 microns. In a typical test situation, three drain bias conditions according to Vds breakdown voltage are chosen for sampling. Device DC HCI lifetime is typically defined as the time required to cause 10 percent degradation of forward drain current in saturation mode under operation condition Vcc. Accordingly, if a device reaches 10 percent degradation in this situation, the operating time up to that point of degradation is the actual lifetime of the device.

Figure 3:
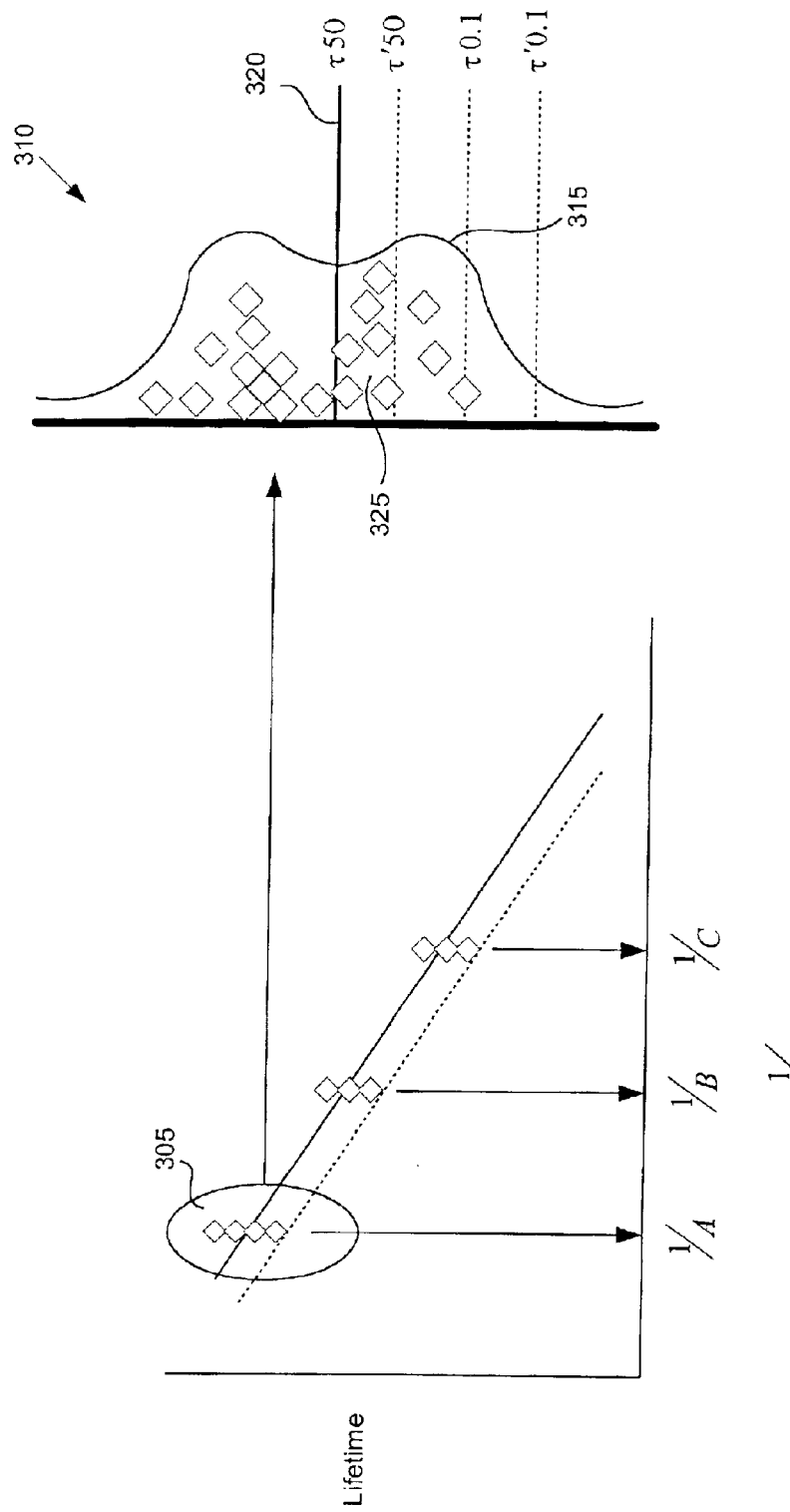
FIG. 3 is an exemplary graphical representation of the device lifetime versus Isub/W and an associated bimodal sample distribution.

In another exemplary embodiment, collected data points may exhibit a substantially bimodal distribution 310 as depicted in FIG. 3 of collected data points at each stress condition, such as those collected at stress condition $1/A$ 305. The method includes, for example, collecting data such as data set 305 and similarly data sets at other stress conditions such as stress condition $1/B$ and $1/C$. Similar to the unimodal situation, a $\tau 0.1$ lifetime stress condition $1/A$ is calculated. Because of the bimodal distribution, an alternative method is used to estimate $\tau 0.1$. First, a number of total samples, or population n at stress condition A is established. Further, the median, $\tau 50$ 320 is determined and the standard deviation $\sigma$ for the entire population is also determined. Next, the number i of early failures population 325 is determined. The number i is representative of the number of samples which reside below the hump 315 of curve 310 which is representative of the lower lifetime grouping of data points. Once the number i of early failures population has been determined, a median $\tau'50$ for hump 315 may be determined using a calculated $\sigma'$ for the early failure population and by utilizing equation (1). Once $\tau'50$ and $\tau'0.1$ have been established, $\tau 0.1$ may be calculated by the following equation $$\tau 0.1 = \tau'_{\{0.1 \times (n/i)\}} \quad (3)$$

and for example where n=20 and i=5, $$\tau 0.1 = \tau'_{\{0.1 \times (20/5)\}}$$
$$= \tau'_{0.4}$$
$$= \tau'_{50} \times \exp\{-cdf^{-1}(0.4) \times \sigma'\}$$
$$= 15 \text{ years.}$$

This example is representative of the type of calculation that may be carried out with regards to the invention, however, the inventive processes are not limited to the values or algorithms provided in the example. Once $\tau 0.1$ has been calculated for stress condition $1/A$, the calculations are repeated for stress conditions $1/B$ and $1/C$. A slope of lifetime and intercept at $\tau 0.1$ is then determined. Once determined, the maximum Vds (Vcc) for a desired lifetime (e.g., 10 years) may be calculated. Also, lifetime may be calculated using equation (2) as previously described.

Figure 4:
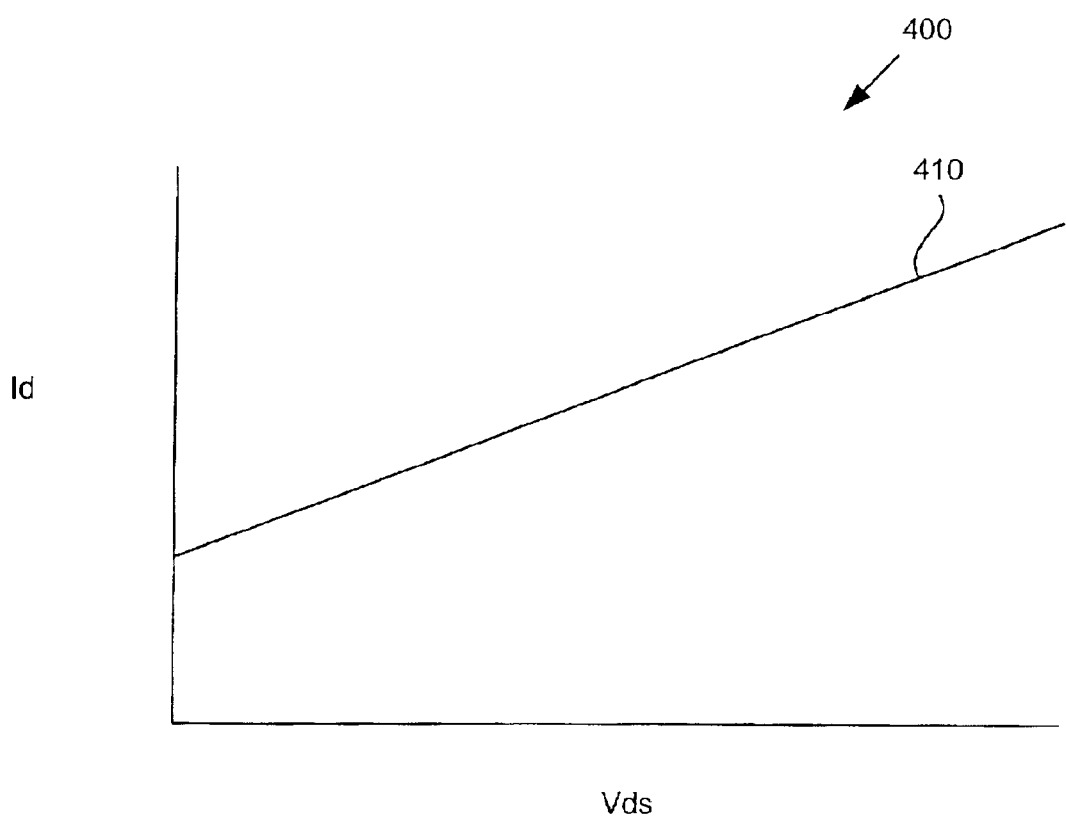
FIG. 4 is an exemplary graphical representation of the relationship between drain current and drain-source voltage.
Figure 5:
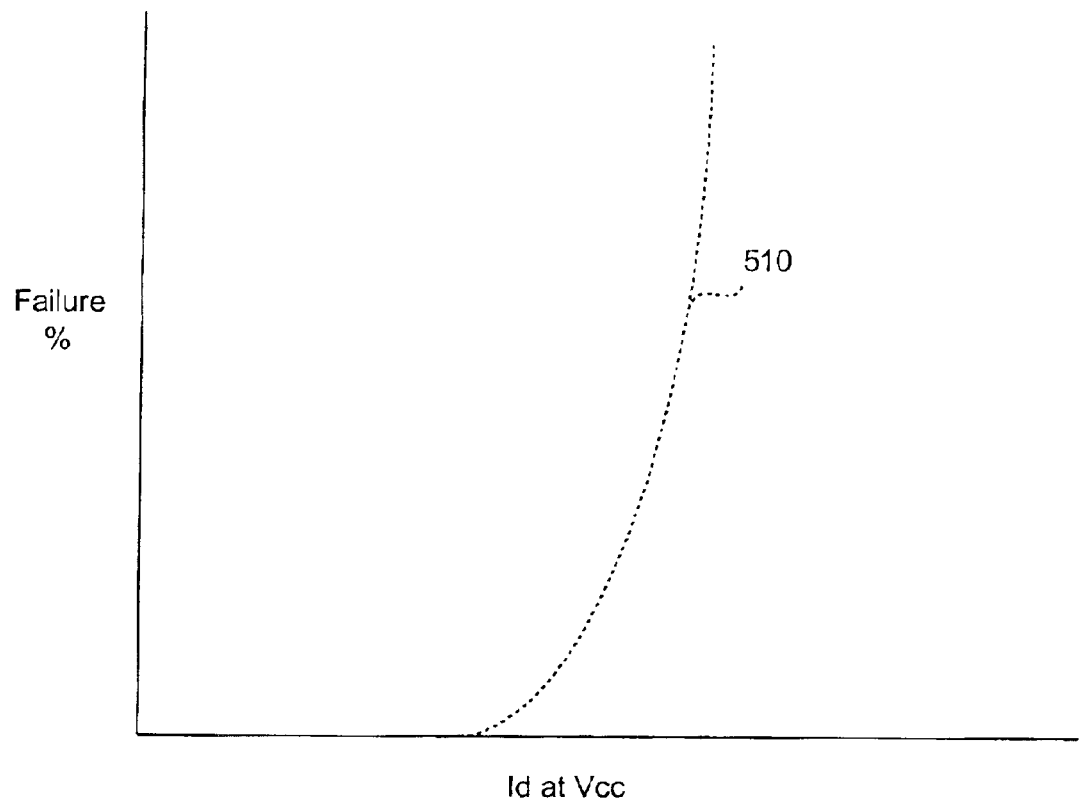
FIG. 5 is an exemplary graphical representation of the cumulative failure percentage versus Isubmax.
Figure 6:
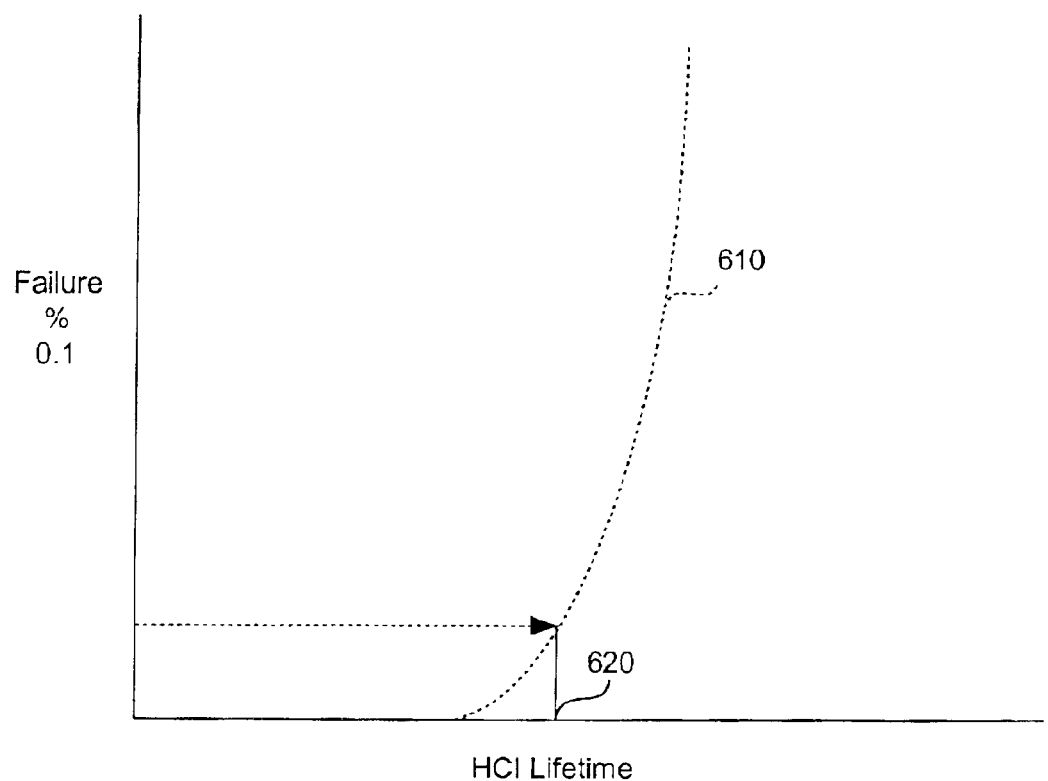
FIG. 6 is an exemplary graphical representation of the cumulative failure percentage versus HCI lifetime.

Referring now to FIG. 4, a device characterization may be performed to determine an approximate relationship 410 between the drain current (Id) and the drain-source voltage (Vds), as represented by graph 400. Once the device has been characterized, Ids is monitored at operating conditions (Vcc). The percentage of failures at varying levels of Ids may be obtained, represented by the relationship 510 depicted in FIG. 5. Utilizing equation (2) and the relationships depicted in FIGS. 4 and 5, a relationship 610 depicted in FIG. 6 may be established. Relationship 610 represents HCI lifetime versus cumulative failure percent. Accordingly, if a 0.1 cumulative failure percent is desired, HCI lifetime may then be determined as a lifetime value 620. At this point, it may be determined whether the lifetime being seen by devices at operating conditions meeting the $\tau 0.1$ criterion matches with or exceeds the desired lifetime. Conversely, the lifetime for a particular device may be established and a determination of whether it meets the $\tau 0.1$ lifetime criterion may be determined.

Figure 7:
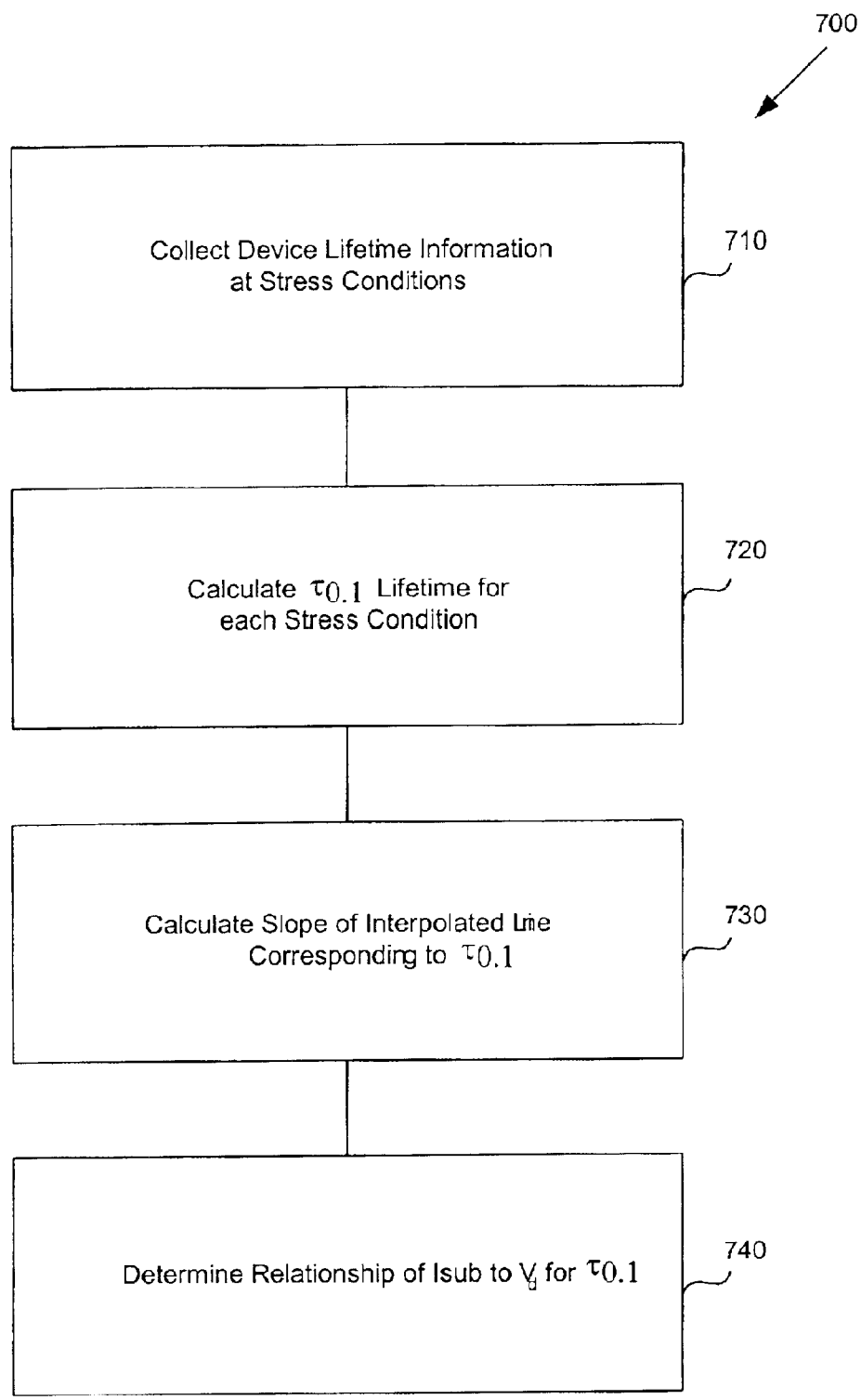
FIG. 7 is an exemplary flow diagram of a device lifetime projection process.

Referring now to FIG. 7, an exemplary device lifetime projection process 700 is depicted. The process includes collecting device lifetime information at a plurality of stress conditions, for example, a variety of predetermined drain-source voltage conditions as described above (step 710). Once the plurality of devices have been tested at the stress conditions, a $\tau 0.1$ lifetime or other lifetime level may be calculated for each of the stress conditions (step 720). Once $\tau 0.1$ has been calculated for each stress condition, a slope of the interpolated line through each of the stress conditions at $\tau 0.1$ may be calculated (step 730). Using the information calculated, a relationship between substrate current and drain voltage for the $\tau 0.1$ lifetime may then be calculated (step 740). From the substrate current to drain voltage relationship, a maximum Vcc calculation may be made to satisfy the predetermined lifetime criterion.

While the detailed drawings, specific examples and particular formulations given describe preferred and exemplary embodiments, they serve the purpose of illustration only. The inventions disclosed are not limited to the specific forms shown. For example, the methods may be performed in any of a variety of sequence of steps. The hardware configurations and algorithms shown and described may differ depending on the chosen performance characteristics of the processes. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A method of generating a lifetime projection for semiconductor devices, comprising:

collecting device lifetime information for a plurality of semiconductor devices at more than one stress condition, the stress condition being based on an induced drain-source voltage stress condition;

calculating, for each stress condition, a lifetime level at which a predetermined percentage of devices will exceed, each lifetime level being a data point on the stress condition versus lifetime graph;

calculating the slope of an interpolated line through the data points on the stress condition versus lifetime graph; and determining a line corresponding to a ratio of substrate current to gate current versus drain voltage relationship that satisfies the lifetime level, based on the interpolated line information.

2. The method of claim 1, further comprising:

calculating the ratio of substrate current to gate current at operating conditions for a fabricated device.

3. The method of claim 2, further comprising:
   determining the maximum drain-source voltage to achieve a predetermined lifetime.
4. The method of claim 2, further comprising:
   determining the lifetime for the fabricated device.
5. The method of claim 1, wherein the devices include n-type metal oxide semiconductor devices.
6. The method of claim 1, wherein the devices include p-type metal oxide semiconductor devices.
7. The method of claim 1, wherein the predetermined percentage of devices is at least 90 percent.
8. The method of claim 1, wherein the predetermined percentage of devices is at least 99 percent.
9. The method of claim 1, wherein the predetermined percentage of devices is at least 99.9 percent.

* * * * *